(12) United States Patent
Pan et al.

(10) Patent No.: US 9,337,776 B1
(45) Date of Patent: May 10, 2016

(54) HIGH-INPUT COMMON-MODE DIFFERENTIAL AMPLIFIERS

(71) Applicant: Micron Technology, Inc., Boise, ID (US)

(72) Inventors: Feng Pan, Fremont, CA (US); Ramin Ghodsi, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/581,682

(22) Filed: Dec. 23, 2014

(51) Int. Cl.
*G11C 5/14* (2006.01)
*H03F 1/02* (2006.01)
*H03F 3/45* (2006.01)

(52) U.S. Cl.
CPC ............. *H03F 1/0205* (2013.01); *G11C 5/147* (2013.01); *H03F 3/45179* (2013.01); *G11C 5/145* (2013.01); *H03F 2203/45081* (2013.01)

(58) Field of Classification Search
CPC ... G11C 5/145; H03F 1/0205; H03F 3/45179; H03F 2203/45081
USPC .............................. 365/226, 189.11, 205, 207
See application file for complete search history.

(56) References Cited

U.S. PATENT DOCUMENTS

| 4,845,381 | A  | * | 7/1989  | Cuevas  | ............ | H03K 3/356165 |
|           |    |   |         |         |              | 326/63        |
| 5,859,806 | A  | * | 1/1999  | Wada    | ................... | G11C 7/1051 |
|           |    |   |         |         |              | 365/189.05    |
| 6,600,679 | B2 | * | 7/2003  | Tanzawa | ................ | G11C 5/145  |
|           |    |   |         |         |              | 365/189.11    |
| 7,358,790 | B2 | * | 4/2008  | Kuo     | ...................... | H03K 3/012 |
|           |    |   |         |         |              | 326/81        |
| 8,559,247 | B2 | * | 10/2013 | Shiu    | ...................... | G11C 7/1057 |
|           |    |   |         |         |              | 326/68        |

* cited by examiner

*Primary Examiner* — Tan T. Nguyen
(74) *Attorney, Agent, or Firm* — Schwegman Lundberg & Woessner, P.A.

(57) ABSTRACT

The present invention discloses a level-shifting circuit to provide an initial stage to a differential amplifier circuit, a differential amplifier circuit, and a method of operating same. An example level-shifting circuit includes a first transistor and a second transistor to receive a first differential amplifier input. The first transistor has a drain receiving a power input, and the second transistor has a drain coupled to a source of the first transistor and a source coupled to a biased tail circuit. The example level-shifting circuit further includes a third transistor and a fourth transistor to receive a second differential amplifier input. The third transistor has a drain receiving a power input and the fourth transistor has a drain coupled to a source of the third transistor and a source coupled to the biased tail circuit. Other examples, methods, and apparatuses are described herein.

20 Claims, 7 Drawing Sheets

HIGH-INPUT COMMON-MODE DIFFERENTIAL AMPLIFIERS

BACKGROUND

Many electronic systems, such as computers and mobile devices, use differential amplifier circuits to provide linear amplification with little or no distortion. Ongoing efforts are directed to reducing power consumption and chip layout area of differential amplifier circuits.

DETAILED DESCRIPTION

Complementary metal-oxide-semiconductor (CMOS) transistors can be used in a wide variety of amplifiers and switches. One such use is as a differential amplifier. Differential amplifiers have a variety of uses in applications such as CMOS input buffers, in some types of video amplifiers, and in balanced line receivers for digital data transmission. Differential amplifiers are often used to "detect" the voltage relationship between two voltage inputs.

Figure 1:
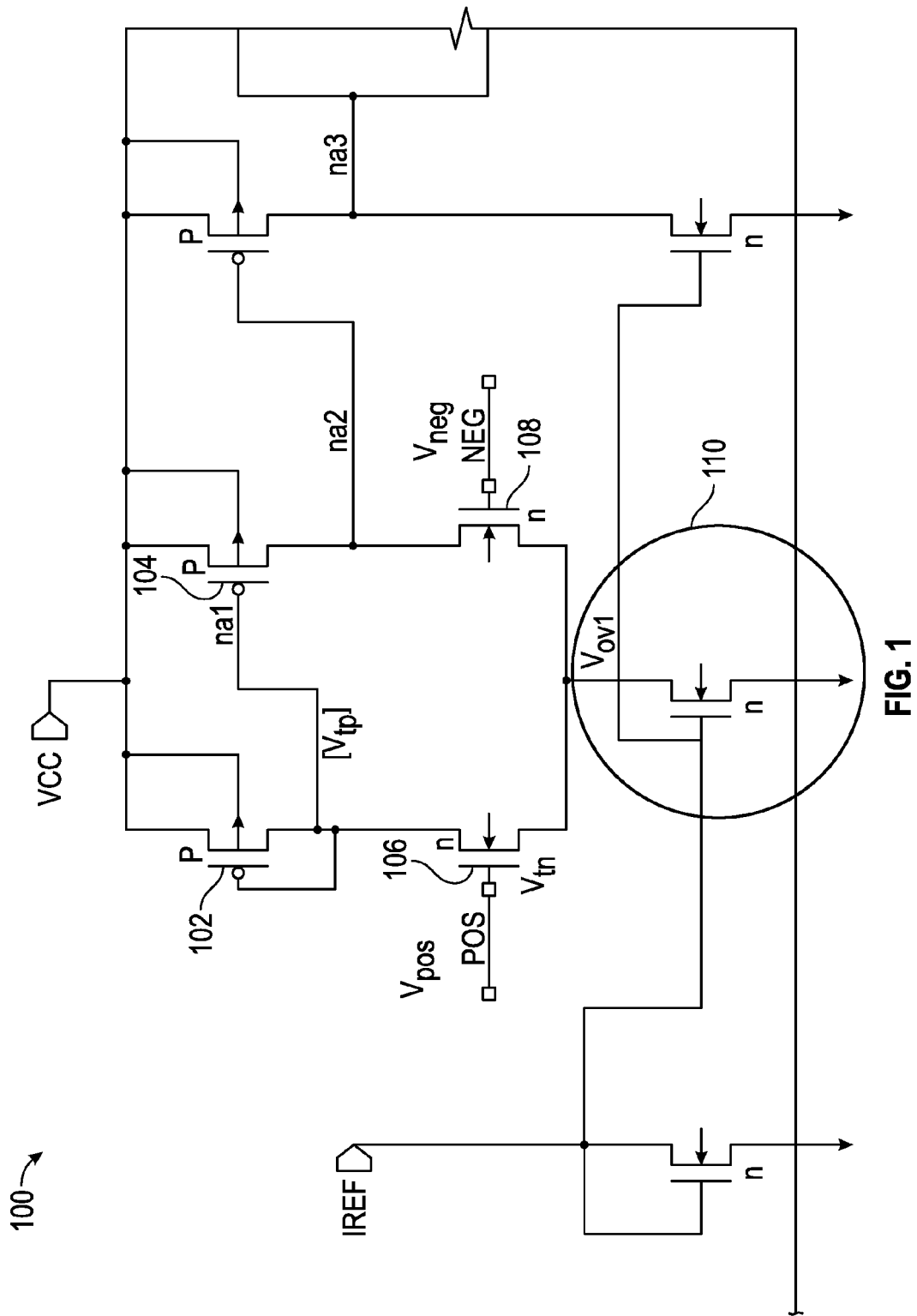
FIG. 1 is a partial schematic diagram of a differential amplifier as can be used in some available systems.

FIG. 1 is a partial schematic diagram of a differential amplifier 100 as can be used in some available systems. The differential amplifier 100 has a supply voltage Vcc. Transistors, for example, p-channel metal-oxide-semiconductor (PMOS) transistors 102 and 104 are separately coupled to the supply voltage Vcc. The PMOS transistors 102, 104 each have a threshold voltage Vtp at which the PMOS transistors 102, 104 will pass voltage (e.g., leave the 'OFF' state). Transistors, for example n-channel metal-oxide-semiconductor (NMOS) transistors 106 and 108 are coupled to first and second differential inputs Vpos and Vneg. The NMOS transistors 106, 108 each have a threshold voltage Vtn. A biased tail circuit 110 provides a path between the output voltage Vov1 and ground.

The minimum Vcc to operate the differential amplifier 100 in the saturation region for various output voltages, threshold voltages, and common mode inputs can be calculated according to:

$$\text{minimum } Vcc = Vov1 + (Vpos*Vneg - Vov1 - Vtn) + |Vtp| \quad (1)$$

Equation (1) can be reduced to:

$$\text{minimum } Vcc = Vpos*Vneg - Vtn + |Vtp| \quad (2)$$

Equation (2) signifies that the minimum Vcc to operate the differential amplifier 100 in the saturation region is a function of the threshold voltages Vtn and Vtp, and the common mode input of the differential amplifier 100. The maximum common mode input determines Vtn, Vtp, and, by extension the power supply needed to operate the differential amplifier 100.

Figure 2:
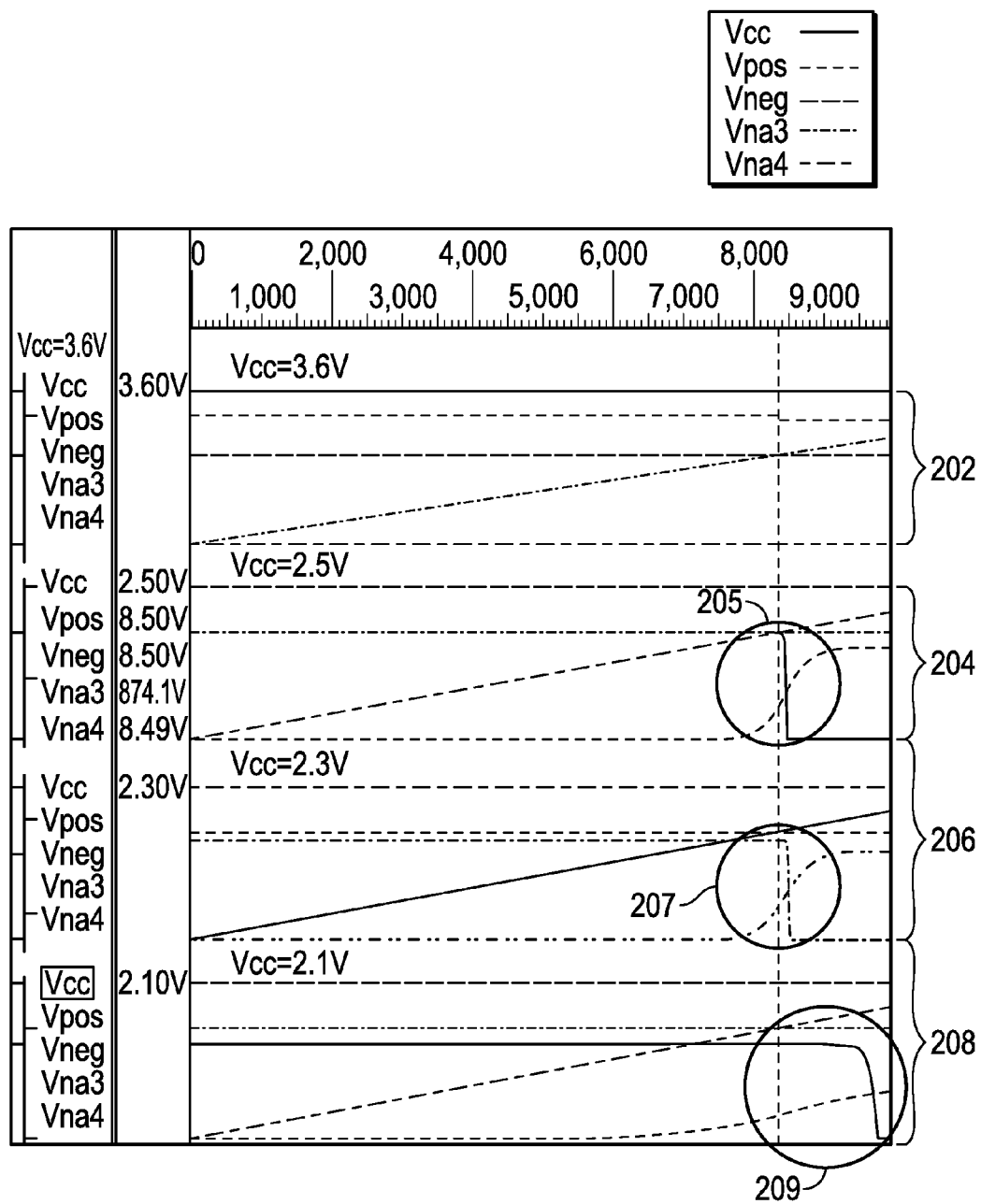
FIG. 2 illustrates waveforms of signals during operation of the differential amplifier of FIG. 1 for purposes of illustrating gain loss with decreased power supply to the differential amplifier.

As Vcc decreases, transistors 102, 104, 106, and 108 may enter the linear region, leading to gain drop in the differential amplifier 100 and increased errors in the output of the differential amplifier 100. FIG. 2 illustrates waveforms of signals during operation of the differential amplifier 100 of FIG. 1 for purposes of illustrating gain loss with decreased power supply to the differential amplifier 100.

In each waveform 202, 204, 206 and 208, the differential input Vpos is held at 2.5 volts, while Vneg is ramped from 0 to 3 volts. When Vneg equals Vpos, the output voltage NA3 should switch up to 2.5 and the voltage NA4 should switch down to zero.

Waveform 202 illustrates voltages at points NA3 and NA4 when Vcc is 3.6 volts. Waveform 204 illustrates voltages at points NA3 and NA4 when Vcc is 2.5 volts. Waveform 206 illustrates voltages at points NA3 and NA4 when Vcc is 2.3 volts. Finally, waveform 208 illustrates voltages at points NA3 and NA4 when Vcc is 2.1 volts. By comparing waveforms 202, 204, 206, and 208, one of ordinary skill in the art will note decreasing gain, and increasing errors 205, 207, and 209 as Vcc is decreased.

Some available circuits for increasing gain and reducing errors include use of a source follower circuit that provides additional resistors to left-shift down the common mode voltage of Vpos and Vneg. However, such an approach requires larger layout area to accommodate the resistors, in addition to additional power draw and complexities arising from resistor matching through use of the resistors. Other approaches include use of fully differential circuits, which uses a common mode feedback circuit to prevent common mode output drifting and lost gain, thereby adding complexity and elevated power requirements.

Embodiments provide high common mode input range while reducing the power requirements of the differential amplifier. Embodiments provide a level-shifting circuit, in combination with a differential pair, to reduce power draw of the differential amplifier while ensuring high-speed operation and reducing or eliminating gain loss.

Figure 3:
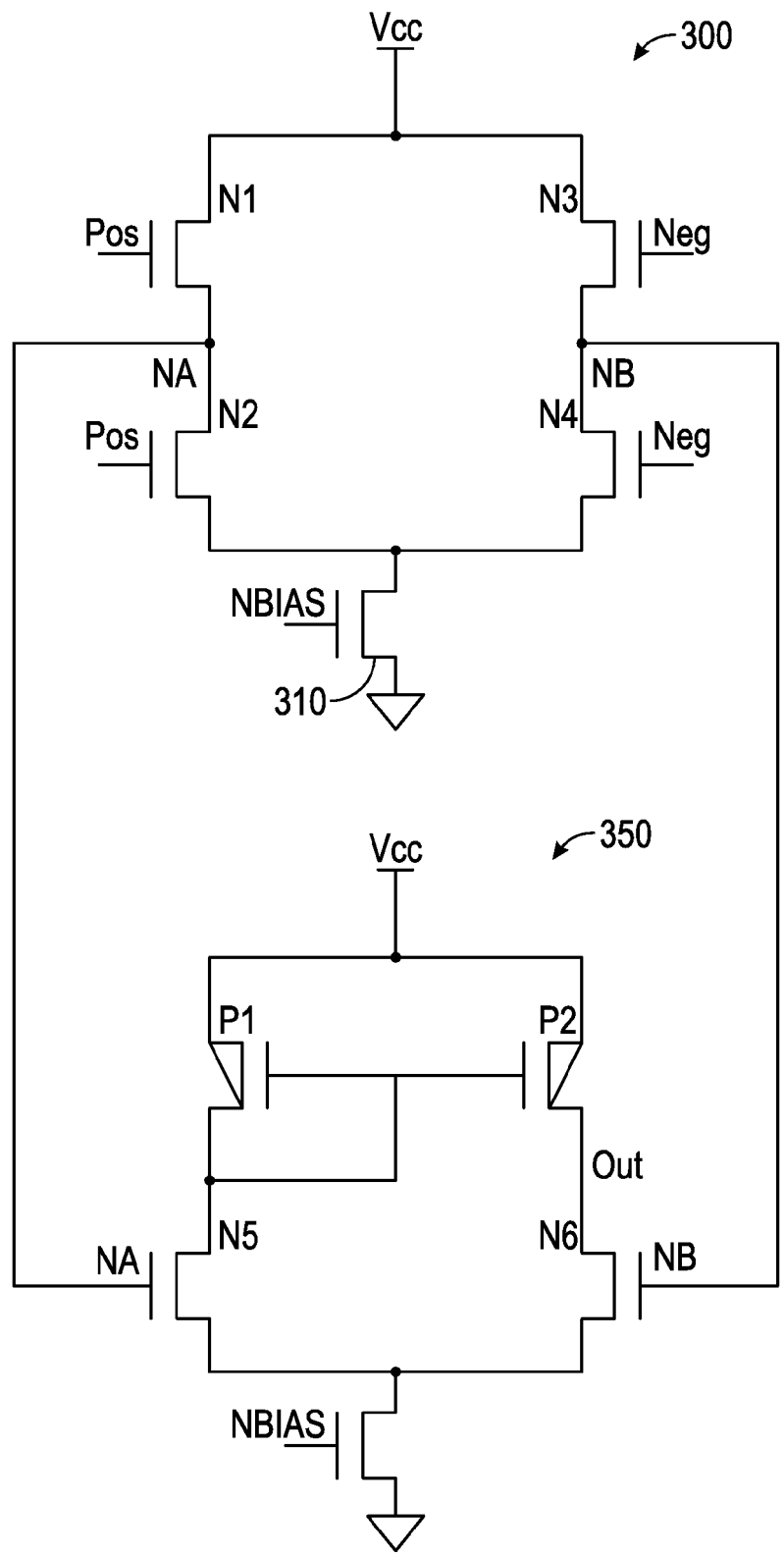
FIG. 3 is a schematic diagram of a circuit including a level-shifting circuit as can be used in a differential amplifier in accordance with a first embodiment and a differential circuit coupled to the level-shifting circuit.

FIG. 3 is a schematic diagram of a circuit including level-shifting circuit 300 as can be used in a differential amplifier in accordance with a first embodiment and a differential circuit 350 as can be used in conjunction with the level-shifting circuit 300. The level-shifting circuit 300 can take inputs over a high common mode input range, and level-shift these inputs down to a lower common mode input range to be provided to a differential pair 350 with a single-ended output.

The level-shifting circuit 300 includes a first transistor N1 and a second transistor N2 each including a gate to receive a first differential amplifier input Pos. The first transistor N1 has a drain receiving a power input Vcc, and the second transistor N2 has a drain coupled to a source of the first transistor N1 and a source coupled to a biased tail circuit NBIAS. The level-shifting circuit 300 includes a third transistor N3 and a fourth transistor N4 each including a gate to receive a second differential amplifier input Neg. The third transistor N3 includes a drain receiving power input Vcc and the fourth transistor N4 includes a drain coupled to a source of the third transistor N3 and a source coupled to the biased tail circuit NBIAS. Each of the first transistor N1, the second transistor N2, the third transistor N3, and the fourth transistor N4 can include an n-type complementary metal-oxide-semiconductor (CMOS) transistor, or NMOS.

The level-shifting circuit 300 further includes output nodes NA and NB to provide a level-shifted output to a differential amplifier circuit 350. The biased tail circuit NBIAS includes a fifth transistor 310 with a drain coupled to the source of the second transistor N2 and to the source of the fourth transistor N4, and a source coupled to a ground of the level-shifting circuit 300 The biased tail circuit NBIAS provides a tail current to the level-shifting circuit 300.

The differential circuit 350 can be used in a differential amplifier in accordance with some embodiments. The differential circuit 350 can include two NMOS transistors N5 and N6, and two p-type CMOS transistors (PMOS) P1 and P2. The differential circuit 350 can further include a biased tail circuit NBIAS. As described above, the differential circuit 350 will receive the level-shifted common mode inputs from the level-shifting circuit 300 to provide a single-ended output Out.

Figure 4:
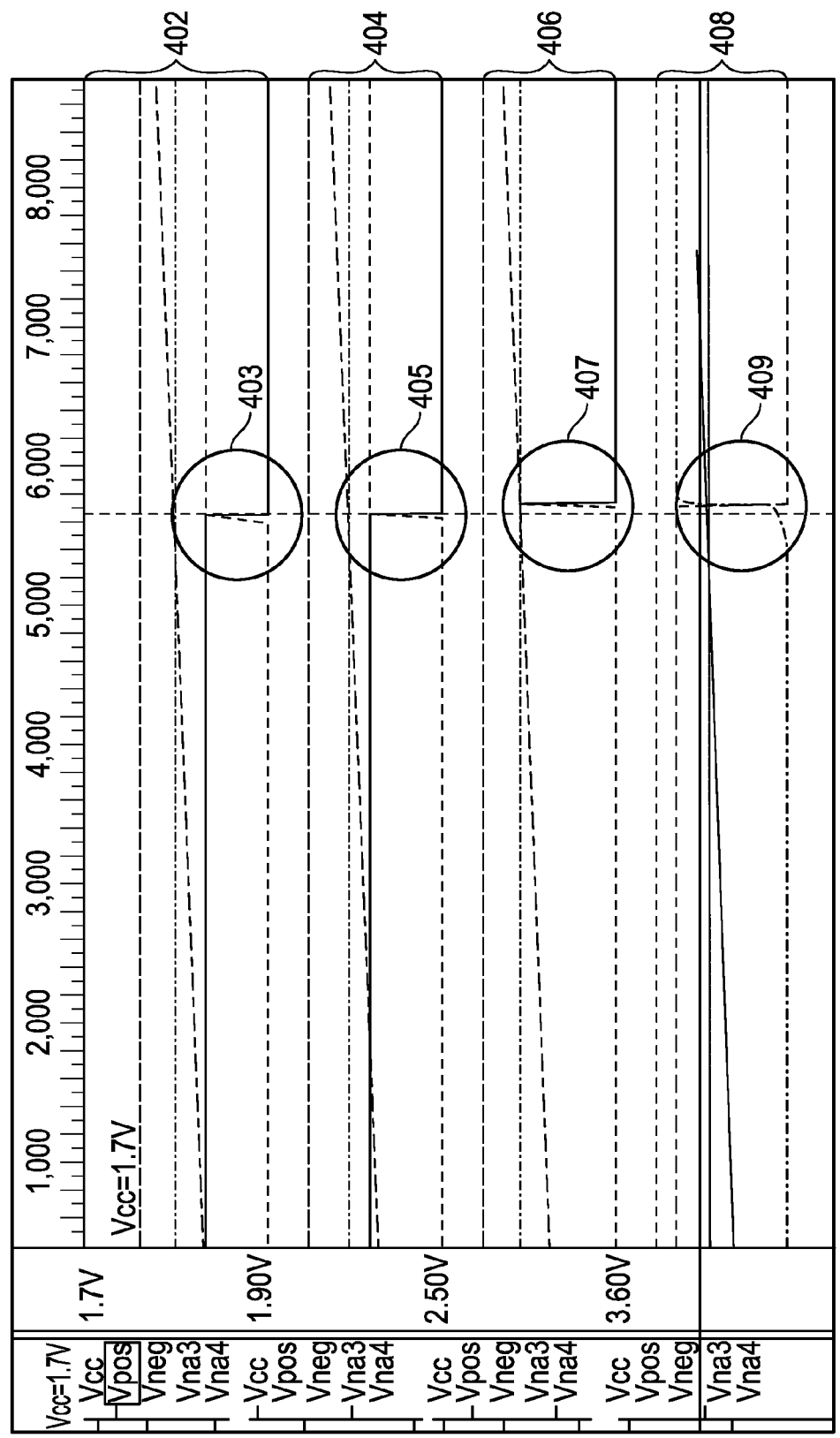
FIG. 4 illustrates waveforms of signals during operation of a differential amplifier including a level-shifting circuit of FIG. 3.

FIG. 4 illustrates waveforms of signals during operation of a differential amplifier including a level-shifting circuit 300 (FIG. 3) in accordance with some embodiments.

In each waveform 402, 404, 406 and 408, the differential input Vpos is held at 2.5 volts, while Vneg is ramped from 0 to 3 volts. When Vneg equals Vpos, the output voltage NA3 should switch up to 2.5 and the voltage NA4 should switch down to zero.

Waveform 402 illustrates voltages at points NA3 and NA4 when Vcc is 1.7 volts. Waveform 404 illustrates voltages at points NA3 and NA4 when Vcc is 1.9 volts. Waveform 406 illustrates voltages at points NA3 and NA4 when Vcc is 2.5 volts. Finally, waveform 408 illustrates voltages at points NA3 and NA4 when Vcc is 3.6 volts. By comparing waveforms 402, 404, 406, and 408 with waveforms 202, 204, 206, and 208 (FIG. 2), one of ordinary skill in the art will note that errors 405, 407, and 409 are much smaller than corresponding errors 205, 207, and 209 (FIG. 2) as Vcc is decreased.

Figure 5:
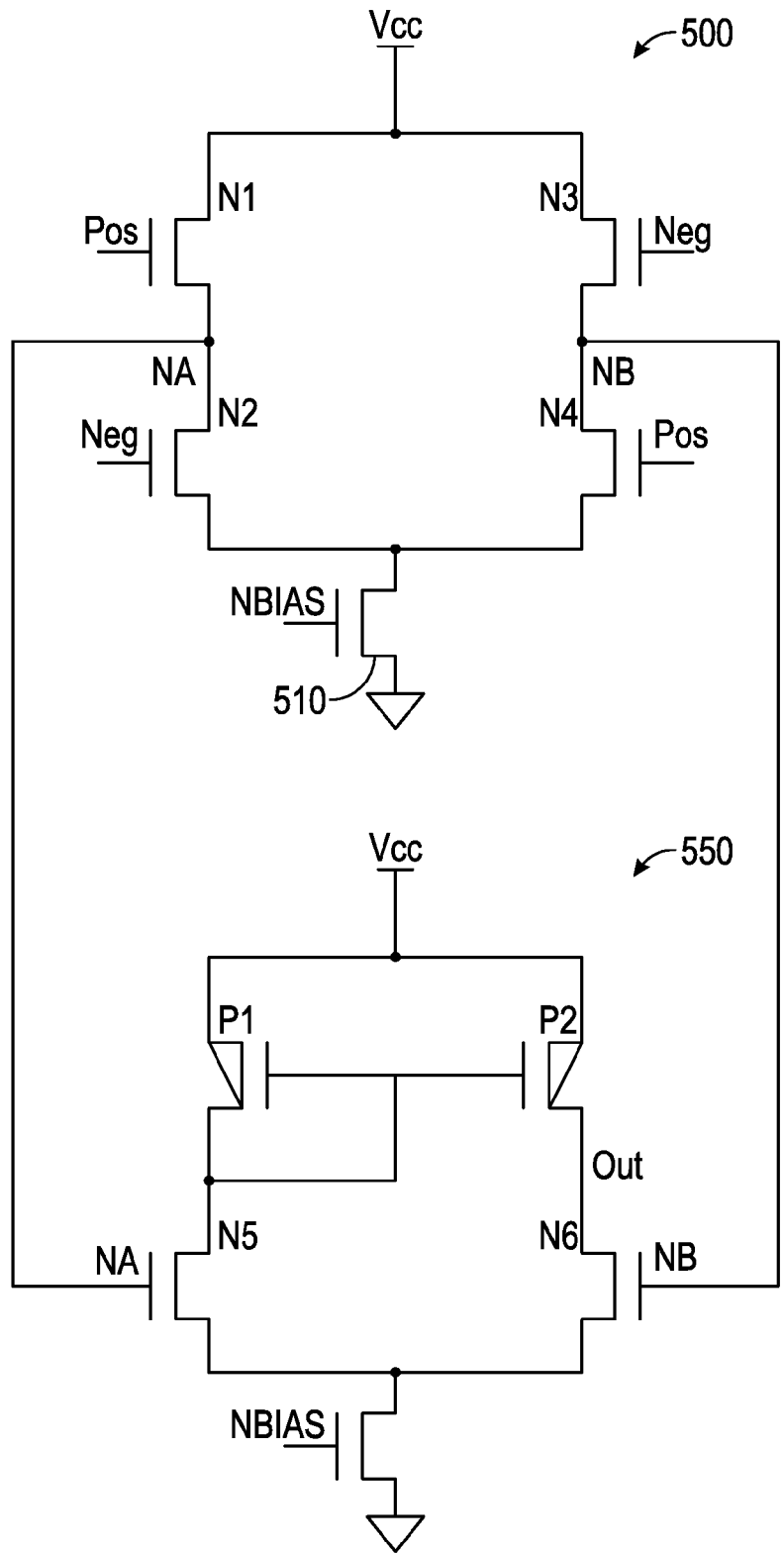
FIG. 5 is a schematic diagram of a circuit including a level-shifting circuit as can be used in a differential amplifier in accordance with a second embodiment and a differential circuit coupled to the level-shifting circuit.

FIG. 5 is a schematic diagram of a level-shifting circuit 500 as can be used in a differential amplifier in accordance with a second embodiment. The level-shifting circuit 500 includes a first transistor N1 and a second transistor N2. The first transistor N1 receives a first differential amplifier input Pos, and the second transistor N2 receives a second differential input Neg of the differential amplifier. The first transistor N1 includes a drain receiving a power input Vcc, and the second transistor N2 includes a drain coupled to a source of the first transistor N1 and a source coupled to a biased tail circuit NBIAS. The level-shifting circuit 500 includes a third transistor N3 and a fourth transistor N4. The third transistor N3 receives the second differential amplifier input Neg of the differential amplifier, and the fourth transistor N4 receives the first differential input Pos of the differential amplifier. The third transistor N3 includes a drain receiving the power input Vcc and the fourth transistor N4 includes a drain coupled to a source of the third transistor N3 and a source coupled to the biased tail circuit NBIAS. Each of the first transistor N1, the second transistor N2, the third transistor N3, and the fourth transistor N4 can include an NMOS.

The level-shifting circuit 500 further includes output nodes NA and NB to provide a level-shifted output to a differential amplifier circuit 550. The differential amplifier circuit 550 may be arranged similarly to, and include similar components as, the differential amplifier circuit 350 (FIG. 3).

The biased tail circuit NBIAS includes a fifth transistor 510 with a drain coupled to the source of the second transistor N2 and to the source of the fourth transistor N4, and a source coupled to a ground of the level-shifting circuit 500 to form an impedance divider circuit.

The level-shifting circuit 500 includes a differential type of input. Accordingly, the outputs NA, NB of the level-shifting circuit 500 will include at least some additional differential gain at the outputs NA, NB.

Figure 6:
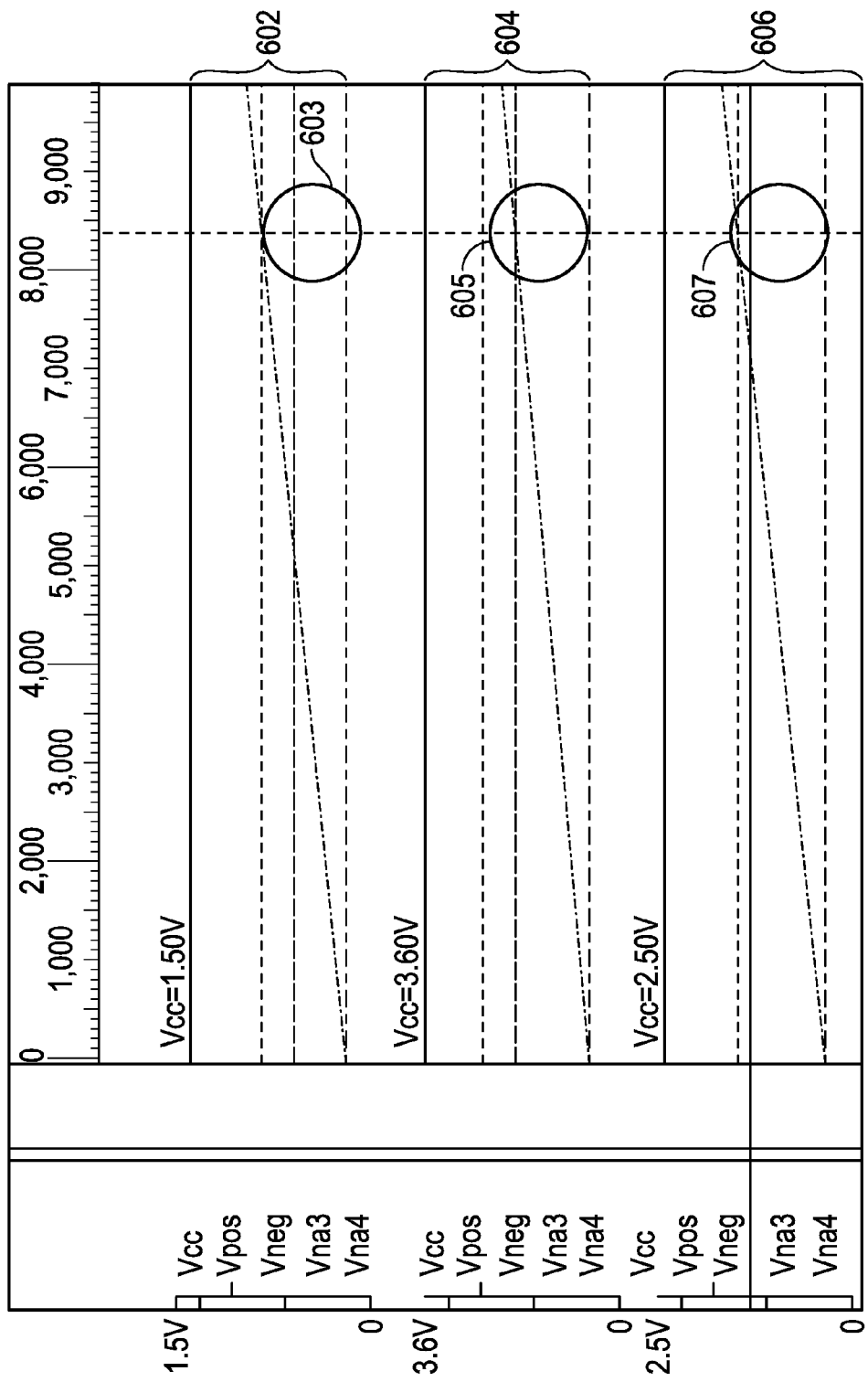
FIG. 6 illustrates waveforms of signals during operation of a differential amplifier including a level-shifting circuit of FIG. 5.

FIG. 6 illustrates waveforms of signals during operation of a differential amplifier including a level-shifting circuit 500 (FIG. 5) in accordance with some embodiments.

In each waveform 602, 604, 606 and 608, the differential input Vpos is held at 2.5 volts, while Vneg is ramped from 0 to 3 volts. When Vneg equals Vpos, the output voltage NA3 should switch up to 2.5 and the voltage NA4 should switch down to zero.

Waveform 602 illustrates voltages at points NA3 and NA4 when Vcc is 1.5 volts. Waveform 604 illustrates voltages at points NA3 and NA4 when Vcc is 3.6 volts. Waveform 606 illustrates voltages at points NA3 and NA4 when Vcc is 2.5 volts. By comparing waveforms 602, 604, and 606 with waveforms 202, 204, 206, and 208 (FIG. 2) and 402, 404, 406 and 408 (FIG. 4) one of ordinary skill in the art will note that errors 603, 605 and 607 are much smaller than corresponding errors 205, 207, and 209 (FIG. 2) and 403, 405, 407 and 409 as Vcc is decreased due at least to the additional differential gain provided by the level-shifting circuit 400.

Level-shifting circuits in accordance with various embodiments provide for increased speed of differential amplifiers relative to some available differential amplifiers. Furthermore, level-shifting circuits in accordance with various embodiments can allow the common mode input to be at least as high or higher than the voltage supply Vcc, which can allow a differential amplifier to operate with lower Vcc, and lower power draw, while still permitting high common mode inputs.

Figure 7:
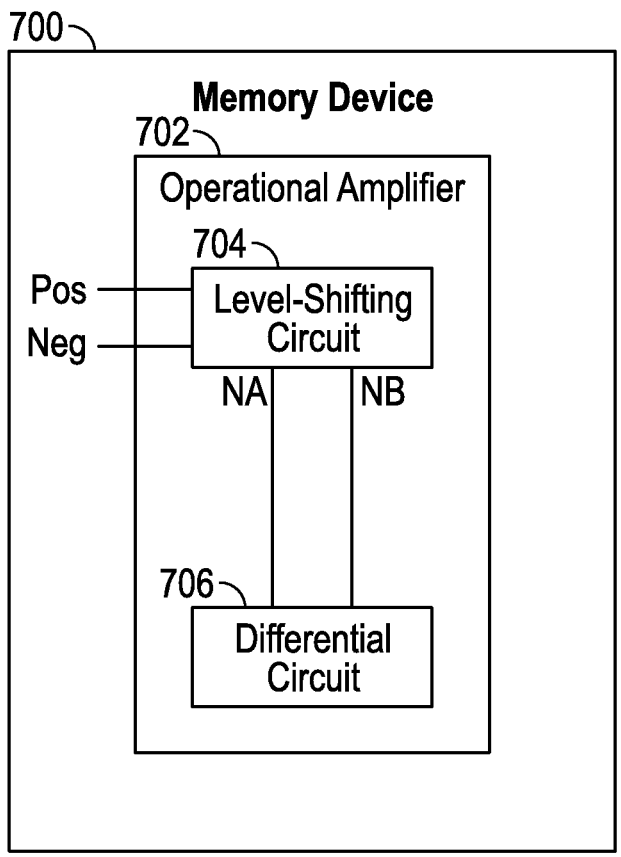
FIG. 7 is a block diagram of a memory device including a differential amplifier of some embodiments.

FIG. 7 is a block diagram of a memory device 700 including an operational amplifier 702. The operational amplifier 702 includes a level-shifting circuit 704, which can be the same or similar as the level-shifting circuit 300 or 500 as described earlier herein with reference to FIGS. 3 and 5, respectively.

For example, the operational amplifier 702 includes a level-shifting circuit 704 to receive a first differential input Pos and a second differential input Neg of the operational amplifier 702. As described earlier herein with respect to FIGS. 3 and 5, the level-shifting circuit 704 includes first and second transistors to each receive the differential input Pos and third and fourth transistors to receive the second differential input Neg. The operational amplifier 702 further includes a differential circuit 706 to receive the level-shifted output from the level-shifting circuit 704. The level-shifting circuit 704 and transistors therein, in addition to other circuitry, can be arranged according to the arrangements described above with respect to FIGS. 3 and 5, although embodiments are not limited thereto.

Figure 8:
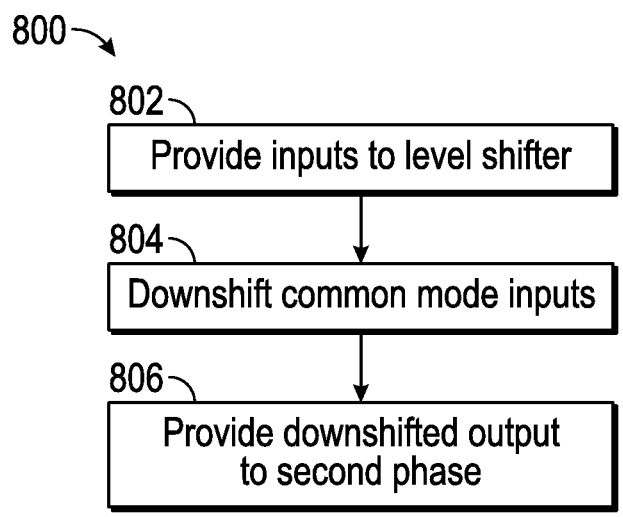
FIG. 8 is a flow diagram showing an example method of operating an operational amplifier of some embodiments.

FIG. 8 is a flow diagram showing an example method 800 of operating an operational amplifier of some embodiments. The method 800 can be implemented using an operational amplifier similar to operational amplifier 706, level-shifting circuit 300, level-shifting circuit 500, etc., although embodiments are not limited thereto.

Example method 800 begins at operation 802 by providing inputs to a level-shifting circuit of the operational amplifier. The inputs can include a first differential input, provided to each of two first transistors of level-shifting circuit, and a second differential input, provided to each of two second transistors of the level-shifting circuit.

Example method 800 continues with operation 804 by downshifting the common mode inputs to a particular range to generate a downshifted output.

Example method 800 continues with operation 806 by providing the downshifted output to a second phase of the operational amplifier to generate an operational amplifier output. Operation 806 can include controlling a biased tail circuit of the level-shifting circuit to shift the common mode output range fed into a second phase of amplifier.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A level-shifting circuit comprising:
    a first transistor and a second transistor each including a gate to receive a first differential amplifier input, the first transistor having a drain receiving a power input, and the second transistor having a drain coupled to a source of the first transistor and a source coupled to a biased tail circuit; and
    a third transistor and a fourth transistor each including a gate to receive a second differential amplifier input, the third transistor having a drain receiving a power input and the fourth transistor having a drain coupled to a source of the third transistor and a source coupled to the biased tail circuit.

2. The level-shifting circuit of claim 1, wherein each of the first transistor, the second transistor, the third transistor, and the fourth transistor include an n-type complementary metal-oxide-semiconductor (CMOS) transistor.

3. The level-shifting circuit of claim 1, further comprising output nodes to provide level-shifted outputs to a differential amplifier circuit.

4. The level-shifting circuit of claim 1, wherein the biased tail circuit includes a fifth transistor with a drain coupled to the source of the second transistor and to the source of the fourth transistor, and a source coupled to a ground of the level-shifting circuit.

5. A level-shifting circuit comprising:
    a first transistor and a second transistor, the first transistor receiving a first differential amplifier input, and the second transistor receiving a second differential amplifier input, the first transistor having a drain receiving a power input, and the second transistor having a drain coupled to a source of the first transistor and a source coupled to a biased tail circuit, and
    a third transistor and a fourth transistor, the third transistor receiving the second differential amplifier input, and the fourth transistor receiving the first differential amplifier input, the third transistor having a drain receiving the power input and the fourth transistor having a drain coupled to a source of the third transistor and a source coupled to the biased tail circuit.

6. The level-shifting circuit of claim 5, wherein each of the first transistor, the second transistor, the third transistor, and the fourth transistor include an n-type complementary metal-oxide-semiconductor (CMOS) transistor.

7. The level-shifting circuit of claim 5, further comprising output nodes to provide level-shifted outputs to a differential amplifier circuit.

8. The level-shifting circuit of claim 5, wherein the biased tail circuit includes a fifth transistor with a drain coupled to the source of the second transistor and to the source of the fourth transistor, and a source coupled to a ground of the level-shifting circuit.

9. An operational amplifier, comprising:
    a level-shifting circuit to receive a first differential input and a second differential input of the operational amplifier, the level-shifting circuit including
        a first transistor and a second transistor to receive the first differential input,
        a third transistor and a fourth transistor to receive the second differential input, and output nodes to provide a level-shifted output based on the first differential input and the second differential input; and a differential circuit to receive the level-shifted output.

10. The operational amplifier of claim 9, wherein the first transistor includes a drain receiving a power input, and the second transistor includes a drain coupled to a source of the first transistor and a source coupled to a biased tail circuit, and the third transistor includes a drain receiving the power input and the fourth transistor includes a drain coupled to a source of the third transistor and a source coupled to the biased tail circuit.

11. The operational amplifier of claim 9, wherein the first transistor includes a drain receiving a power input, and the second transistor includes a drain coupled to a source of the first transistor and a source coupled to a biased tail circuit, and the third transistor includes a drain receiving the power input and the fourth transistor includes a drain coupled to a source of the third transistor and a source coupled to the biased tail circuit.

12. The operational amplifier of claim 9, wherein each of the first transistor, the second transistor, the third transistor, and the fourth transistor include an n-type complementary metal-oxide-semiconductor (CMOS) transistor.

13. The operational amplifier of claim 9, wherein the differential circuit includes a fifth transistor, a sixth transistor, a seventh transistor, and an eighth transistor, wherein the fifth and sixth transistor each include a source coupled to the power supply.

14. The operational amplifier of claim 13, wherein the fifth transistor and the sixth transistor each include a p-type complementary metal-oxide-semiconductor (CMOS) transistor.

15. A method of using an operational amplifier, the method comprising:

providing inputs to a level-shifting circuit of the operational amplifier;

downshifting the common mode inputs to a numerical range to generate a downshifted output; and providing the downshifted output to a second phase of the operational amplifier to generate an operational amplifier output.

16. The method of claim 15, wherein providing inputs includes providing a first differential input to each of two first transistors of level-shifting circuit; and providing a second differential input to each of two second transistors of the level-shifting circuit.

17. The method of claim 16, further comprising:

controlling a biased tail circuit of the level-shifting circuit to shift the common mode output range fed into a second phase of amplifier.

18. A memory device including an operational amplifier, the operational amplifier including a level-shifting circuit to receive a first common mode input and a second common mode input of the operational amplifier, the level-shifting circuit including a first n-type complementary metal-oxide-semiconductor (CMOS) transistor and a second n-type CMOS transistor to receive the first common mode input, a third n-type CMOS transistor and a fourth n-type CMOS transistor to receive the second common mode input, and output nodes to provide level-shifted outputs based on the first common mode input and the second common mode input, and a differential circuit to receive the level-shifted output.

19. The memory device of claim 18, wherein the first n-type CMOS transistor includes a drain receiving a power input, and the second n-type CMOS transistor includes a drain coupled to a source of the first n-type CMOS transistor and a source coupled to a biased tail circuit, and the third n-type CMOS transistor includes a drain receiving the power input and the fourth n-type CMOS transistor includes a drain coupled to a source of the third n-type CMOS transistor and a source coupled to the biased tail circuit.

20. The memory device of claim 18, wherein the first n-type CMOS transistor includes a drain receiving a power input, and the second n-type CMOS transistor includes a drain coupled to a source of the first n-type CMOS transistor and a source coupled to a biased tail circuit, and the third n-type CMOS transistor includes a drain receiving the power input and the fourth n-type CMOS transistor includes a drain coupled to a source of the third n-type CMOS transistor and a source coupled to the biased tail circuit.

* * * * *